United States Patent [19]

Tseng et al.

[11] Patent Number: 5,534,457
[45] Date of Patent: Jul. 9, 1996

[54] METHOD OF FORMING A STACKED CAPACITOR WITH AN "I" SHAPED STORAGE NODE

[75] Inventors: Horng-Huei Tseng; Chih-Yuan Lu, both of Hsinchu, Taiwan

[73] Assignee: Industrial Technology Research Institute, Hsinchu, Taiwan

[21] Appl. No.: 375,783

[22] Filed: Jan. 20, 1995

[51] Int. Cl.[6] .......................... H01L 21/70; H01L 27/00
[52] U.S. Cl. ............................... 437/52; 437/60; 437/919
[58] Field of Search .................... 437/47–48, 52, 437/60, 919; 257/303–308

[56] References Cited

U.S. PATENT DOCUMENTS

| | | | |
|---|---|---|---|
| 5,126,916 | 6/1992 | Tseng | 361/313 |
| 5,155,657 | 10/1992 | Oehrlein et al. | 361/313 |
| 5,192,702 | 3/1993 | Tseng | 437/47 |
| 5,422,295 | 6/1995 | Choi et al. | 437/52 |
| 5,441,908 | 8/1995 | Lee et al. | 437/52 |
| 5,496,758 | 3/1996 | Ema | 437/52 |

*Primary Examiner*—H. Jey Tsai
*Attorney, Agent, or Firm*—George O. Saile; William J. Stoffel

[57] ABSTRACT

A DRAM having a high capacitance stacked capacitor is fabricated by forming gate structures in the device areas and lines over field oxide areas on a substrate. A first insulating layer is formed and patterned to leave the source/drain structures open in the device areas where electrical contact is desired to the stacked capacitors. A bottom electrode of the capacitor is now formed by depositing and patterning a second polysilicon layer and a second insulating layer. Next the second polysilicon layer is laterally etched so that portions of the second polysilicon layer are etched out underneath from the second insulating layer. A third polysilicon layer is formed on the vertical sidewalls of the second polysilicon layer. A capacitor dielectric layer is deposited over the substrate surface and patterned so that portions remain covering the second and third polysilicon layers. A top electrode is formed over the capacitor dielectric layer.

19 Claims, 5 Drawing Sheets

5,534,457

METHOD OF FORMING A STACKED CAPACITOR WITH AN "I" SHAPED STORAGE NODE

BACKGROUND OF INVENTION

1. Field of the Invention

The present invention relates to structures and methods of fabricating a dynamic random access memory having a high capacitance stacked capacitor.

2. Description of the Prior Art

Semiconductor device manufactures are continually pressured to increase effective device densities in order to remain cost competitive. As a result, Very Large Scale Integration (VLSI) and Ultra Large Scale Integration (ULSI) technologies have entered the sub-micron realm of structural dimension and now are approaching physical limits in the nanometer feature size range. In the near future, absolute atomic physical limits will be reached in the conventional two-dimensional approach to semiconductor device design. Traditionally, dynamic random access memory (DRAM) designers have faced the severest of challenges in advancing technologies. For example, designers of 64K DRAMs were perplexed to learn that a practical physical limit to charge capacity of storage capacitors had already been reached due to the minimum charge necessary to sense signals in the presence of environmental or particulate radiation inherently present in fabrication materials. Storage capacitors in the range of 50 femtofarads are now considered to be a physical limit. From a practical view, this limitation prevented the scaling of DRAM capacitors. Reduction of the surface area of a semiconductor substrate utilized by the storage capacitor has also been severely restricted. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability.

Due to decreases in the thickness of capacitor materials, existing 1 Megabit (1 MBit) DRAM technologies utilize a planar device in circuit design. Beginning with 4 MBit DRAMs, the world of three-dimensional design has been explored to the extent that the simple single device/capacitor memory cell has been altered to provide the capacitor in a vertical dimension. In such designs the capacitor has been formed in a trench in the surface of the semiconductor substrate. In yet denser designs, other forms of capacitor design are proposed, such as stacking the capacitor above the transfer device.

There are two main approaches in producing capacitors for DRAM's, some manufacturers pursuing trench capacitors built into the crystalline silicon wafer, and other manufacturers pursuing stacked capacitors in which the capacitor is fabricated on top of the wafer surface. In the case of the trench capacitor, its extendibility is in doubt since it is extremely difficult to etch about 0.15–0.25 micrometer wide trenches well over 10 micrometers deep, as well as to then fabricate ultra thin dielectric layers on the trench surface, fill the trench, etc. On the other hand, the use of a stacked capacitor permits a variety of new process options, for example, in the choice of electrode material (polysilicon, silicide, etc.).

A stacked capacitor is fabricated by forming the stacked capacitor structures laying over the gate electrode on active, field oxide, and diffusion regions. The processing of such structures has become very complicated and require lithography and etching steps that are not in step with the very small dimensions required in the present and future state of the art. Although there has been much work done in accomplishing these small size devices and increased capacitance therein, there is still great need for devices with even greater capacitance for a given space in order to achieve even greater packing densities and improve the DRAM products of the future.

Efforts to maintain or increase the storage capacitance in memory cells with greater packing densities is evident in Oehrleim et al. U.S. Pat. No. 5,155,657 which discloses a capacitor comprising one or more main vertical trenches and one or more lateral trenches extending off a main vertical trench. The lateral trenches effectively increase the capacitance of the capacitor.

Tseng U.S. Pat. No. 5,126,916 discloses a stacked capacitor DRAM cell which produces a stacked capacitor over the gates and source areas of a device. Also, Tseng U.S. Pat. No. 5,192,702 discloses a self-aligned cylindrical stacked capacitor DRAM cell.

However, a need continues to exist in the art for an easy to manufacture stacked capacitor having a larger surface area so that the capacitor's capacitance is increased in high density DRAM, without increasing the area occupied by the capacitor structure on or in a silicon substrate.

SUMMARY OF THE INVENTION

It is an object of this invention to provide a process and structure for easily producing a memory cell with a greater capacitance per unit area.

It is an object of this invention to provide a structure and an improved process for producing a memory cell with a greater capacitance per unit area for use in a high density DRAM, without increasing the area occupied by the capacitor structure on or in a silicon substrate and without increasing the processing complexity.

A structure and a process for fabricating an improved dynamic random access memory device having a high capacitance stacked capacitor is provided. The method begins by selectively forming field oxide areas on the surface of a semiconductor substrate while leaving device areas for fabrication of field effect devices. A gate dielectric layer is formed on the substrate in the device areas. A first layer of polysilicon and a top gate insulating layer is deposited on the substrate surface. Portions of the first polysilicon layer and top gate insulating layer are removed while leaving portions to form a gate structure in the device area and form an interconnection line over the field oxide areas having substantially vertical sidewalls. Source/drain structures are formed in the substrate associated with the gate structures. A first insulating layer is formed over portions of said device and field oxide areas. The stacked capacitor is now formed by depositing a second polysilicon layer and a second insulating layer over the substrate surface. The second insulating layer and the second polysilicon layer are patterned so to have the remaining portions of the layers over a source/drain region, and over portions of the gate structure and line. Next the second polysilicon layer is laterally etched so that portions of the second polysilicon layer are etched out beneath the second insulating layer. A third polysilicon layer is deposited over the substrate surface. The third polysilicon layer is etched leaving portions of the doped polysilicon layer on the bottom of the second insulating layer, the vertical sidewalls of the second polysilicon layer, and on portions for the first insulating layer. Subsequently, the second insulating layer is removed. A capacitor dielectric layer is formed covering the second and third polysilicon layers. A top electrode of the capacitor is formed over the capacitor dielectric layer. Metal lines and passivation layers are formed to complete the appropriate connections to form FET and DRAM devices. This invention provides a stacked capacitor with greater capacitance per unit area without using extra masking steps.

DETAILED DESCRIPTION OF THE PREFERRED EMBODIMENTS

Figure 1:
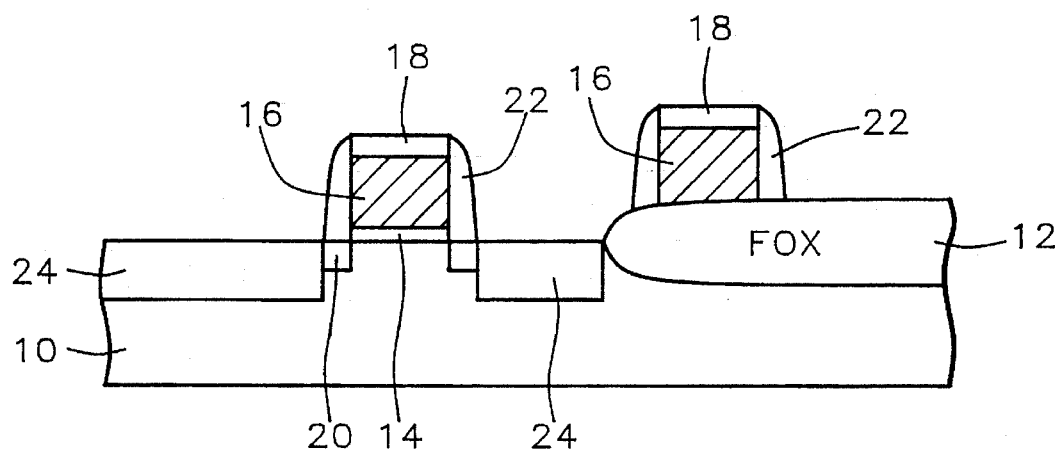
FIGS. 1 through 11 are schematic cross-sectional representations of a structure and a method for fabricating a stacked capacitor in combination with a field effect device which is usable in a DRAM cell.

According to the present invention, a structure and a method for forming an improved stacked capacitor and a field effect device structure is provided. Referring to FIG. 1, the first series of steps involve the formation of the dielectric isolation regions for isolating semiconductor surface regions from other such regions in the semiconductor substrate 10. The semiconductor substrate 10 is preferably composed of silicon having a <100> crystallographic orientation. In an effort to simplify the description and the drawings the dielectric isolation between devices has been only partially shown and will not be described in detail because they are conventional. For example, one method is described by E. Kooi in his U.S. Pat. No. 3,970,486 wherein certain selected surface portions of a silicon semiconductor substrate are masked against oxidation, and then the exposed unmasked surface is oxidized to grow a thermal oxide which in effect sinks into the silicon surface at the unmasked areas. The masked silicon remains as a mesa surrounded by the sunken silicon dioxide or field oxide pattern, FOX 12. Then semiconductor devices can be provided in the silicon mesas (i.e., device areas) according to the following processes.

The surface of the silicon substrate 10 is thermally oxidized to form the desired gate dielectric layer 14 thickness. A preferred thickness is between about 80 to 200 Angstroms. A first polysilicon layer 16 is then blanket deposited by a LPCVD (Low Pressure Chemical Vapor Deposition) method. The preferred thickness of the first polysilicon layer 16 is between about 1000 to 3000 Angstroms. The first polysilicon layer 16 is ion implanted with phosphorous or arsenic ions under the conditions of 5E15 to 10E15 dosage per area and 20 to 60 Kev. In an alternative, the first polysilicon layer 16 can be doped with phosphorus oxychloride at a temperature of about 900° C. A top gate insulating layer 18 composed of silicon dioxide or a glass layer 18 is formed on the polysilicon layer 16. The layers 14, 16, and 18 are patterned by conventional lithography and anisotropic etching techniques as are well known in the art to provide a desired pattern of gate electrodes and interconnection lines (runners) on the FOX 12 surfaces or elsewhere as seen in FIG. 1.

The source/drain structure of the metal oxide semiconductor field effect transistor (MOS FET) may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a complementary MOS (CMOS) FET could in a similar way be formed by making both N channel and P channel devices upon the same substrate. As is understood in the art, the dynamic random access memory (DRAM) cell is composed of a combination device structure of an N channel FET and a stacked capacitor while the peripheral circuits are often composed of CMOS devices. The stacked capacitor is composed of a bottom (lower) electrode or storage node 34, 38 a capacitor dielectric layer 40 and a top (upper) electrode or plate 42 (see FIG. 11 for a representation of a completed capacitor). FIG. 1, for example shows the ion implantations of N− dopants. Lithographic masks may be required to protect the areas not to be subjected to that particular N− ion implantation. The formations of the lithographic masks are done by conventional lithography and etching techniques. The N− lightly doped drain implantation 20 can be performed with, for example phosphorous P31 at a dose of between about 1E13 to 1E14 atoms/cm$^2$ and with an energy of between about 20 to 40 Kev.

The dielectric spacers 22 are now to be formed followed by the completion of the lightly doped drain source/drain structures 20. A low temperature silicon oxide deposition is preferred, such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 22 is between about 1000 to 2500 Angstroms and preferably about 2000 Angstroms.

An anisotropic etching of this layer produces the dielectric sidewall spacer layer 22 on the sidewalls of the line and layer structures 14, 16, 18. The preferred anisotropic etching uses a conventional reactive ion etching ambient. A thin silicon oxide, silicon nitride, or the like masking layer (not shown) is usually formed upon the layer structure regions 14, 16, 18, the spacers 22 and the exposed monocrystalline silicon substrate regions to protect the surfaces from ion implantation damage. The conditions for forming this layer are LPCVD deposition of TEOS or LPCVD silicon nitride deposition at about 600° to 900° C. The preferred thickness of this oxide layer is between about 200 to 1000 Angstroms and a preferred thickness of about 600 Angstroms. The layers 14, 16, 18, and 22, are referred to as gate structures when formed on the substrate device regions and as interconnection lines (16, 18, 22) when formed over the field oxide.

The N+ source/drain ion implantation uses Arsenic, $As_{75}$ with a dose of between about 2E15 to 1E16 atoms/cm$^2$ and energy of between about 20 to 70 Kev. to complete the source/drain regions 24 of the N channel lightly doped drain MOS FET integrated circuits device as seen in the FIG. 1.

Figure 2:
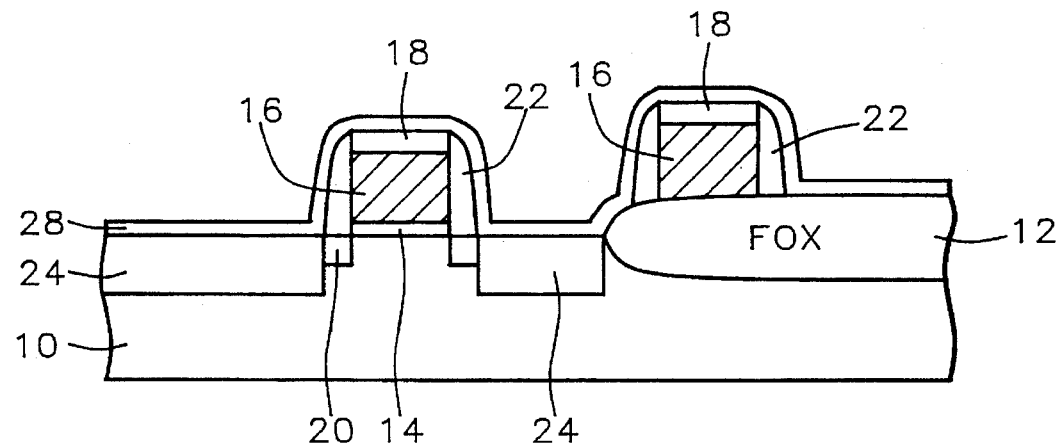
Figure 3:
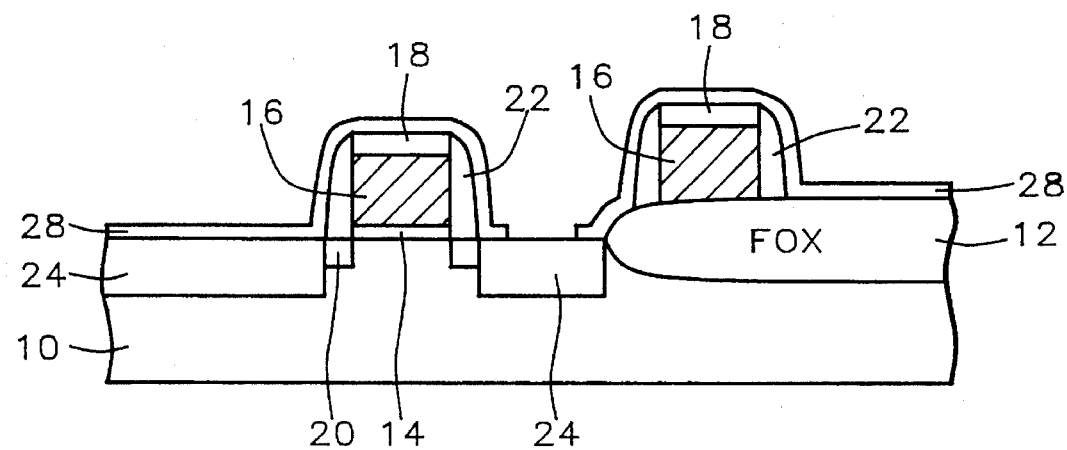

Referring now to FIG. 2, a first insulating layer 28 is formed over the field oxide and device areas. This layer 28 is preferably composed at least in part of silicon nitride for future wet etch stop needs. The layer 28 is typically composed of a layer of silicon oxide and a layer of silicon nitride. Alternatively, the layer 28 can be composed of layers of (top) silicon oxide, silicon nitride and (bottom) silicon oxide (ONO). The silicon oxide layers are formed by low pressure chemical vapor deposition (LPCVD) with reaction temperature of 720° C., reaction gas of $Si(CH_3)_4$, $N_2O$, and Oxygen, and at pressure between about 200 to 300 mTorr. LPCVD is also used for the silicon nitride layer with a reaction temperature of 760° C., reaction gas of SiH$_2$Cl$_2$ and ammonia, and pressure of 350 mTorr. The overall thickness of the layer 28 is between about 600 to 1500 Angstroms with the individual layer thickness being (top) silicon oxide range of between about 200 to 500 Angstroms, silicon nitride of between about 200 to 500 Angstroms and (bottom) silicon oxide of between about 200 to 500 Angstroms. The layer 28 is patterned forming an opening over a source/drain region where electrical contact is desired from the capacitor to the source drain region. This contact is self-aligned as seen in FIG. 3. The opening can be formed by using conventional lithography and etching techniques.

Figure 4:
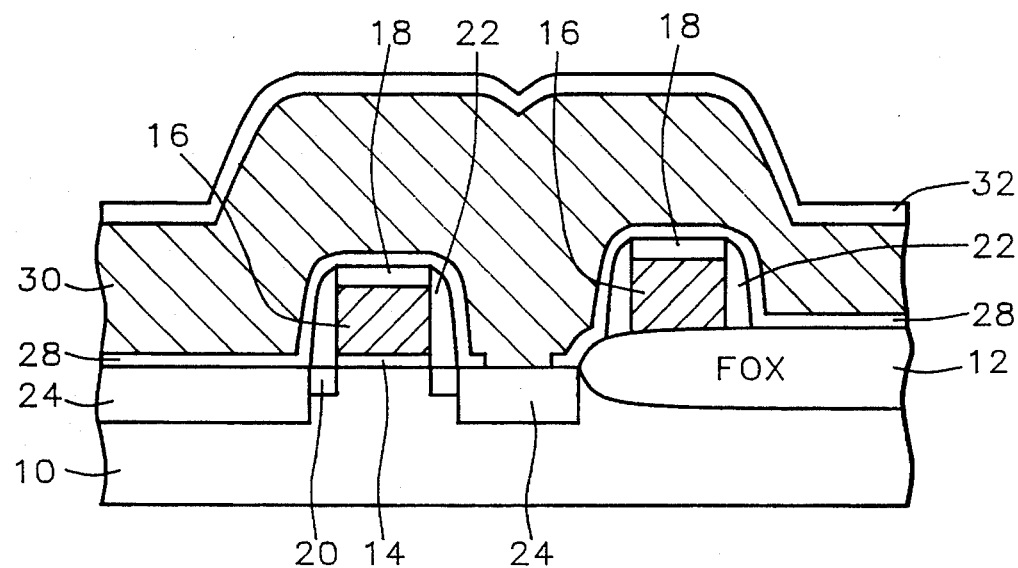

A second layer of polysilicon 30 is deposited over the device and field oxide areas as shown in FIG. 4. The preferred deposition process is in-situ phosphorus doped wherein the temperature is 570° C., the gas is the mixed gas of 15% PH$_3$ and 85% silane, and 5% PH$_3$ and 95% nitrogen. The mixed gas, of 5% PH$_3$ and 95% nitrogen, plays the role of fine-tuning of the dopant concentration between wafers. Alternatively, the layer 30 could be a combination of in-situ doped polysilicon and undoped polysilicon with the former beneath. The undoped polysilicon is formed by a LPCVD process where the reaction gas is silane, the temperature is about 620° C., and the pressure is about 300 mTorr. The thickness of this layer is between about 2000 to 6000 Angstroms. Layer 30 is a self-aligned contact and functions as the lower electrode of the stacked capacitor under construction in the center of source/drain structure 24.

A second insulating layer 32 which is composed of silicon oxide is deposited over the second polysilicon layer 30 by a conventional CVD process. Layer 32 has a thickness of between about 300 to 1000 Angstroms.

Figure 5:
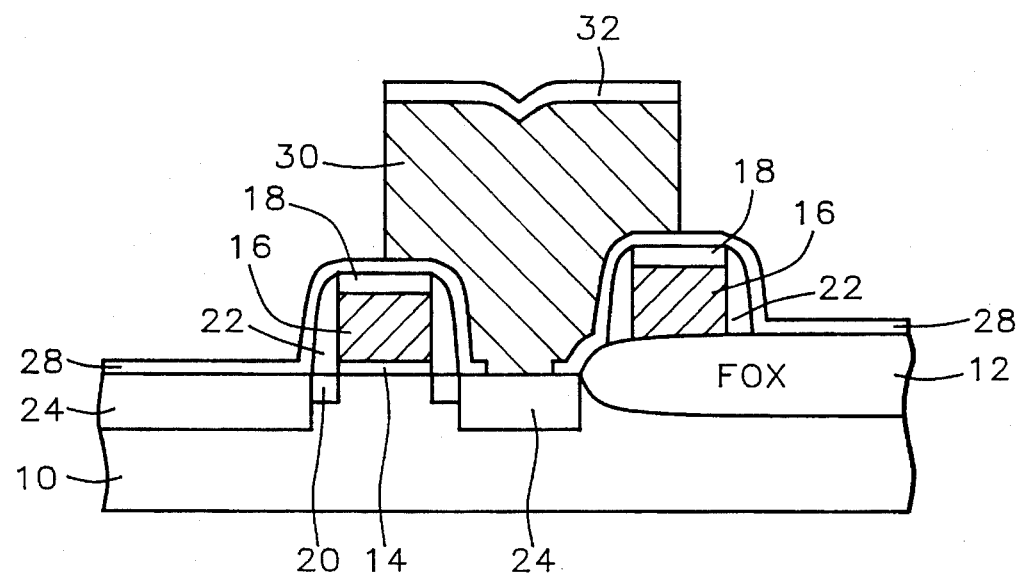

Subsequently, the second insulating layer 32 and the second polysilicon layer 30 are patterned so to have the remaining portions of the layers 30, 32 over the first insulator layer 28, the device areas and over parts of the gate structure and the line 16, 18, 22, 28 as shown in FIG. 5.

Figure 6:
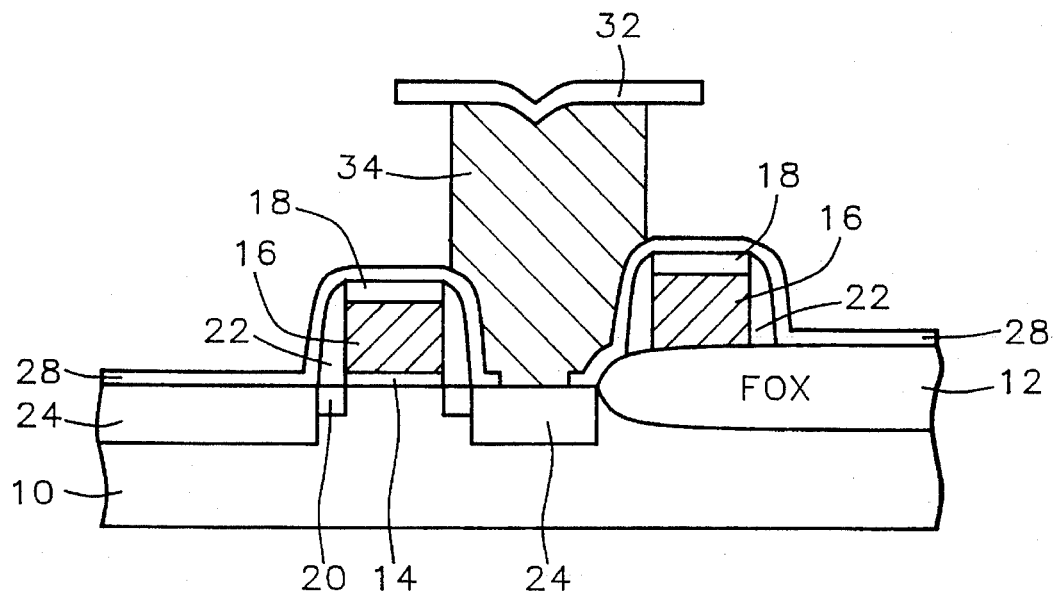

The second polysilicon layer 30 is controllably laterally etched to remove a certain portion of the layer 34 (forming the bottom electrode of the capacitor) (the laterally etched second polysilicon layer 30 is labeled 34) and to thereby leave second insulating layer 32 overextended as seen in FIG. 6. The second polysilicon layer 34 is laterally etched so that portions of the second polysilicon layer 34 are etched out underneath from the second insulating layer 32, whereby the second insulating layer 32 having a top and bottom surfaces, and the second polysilicon layer 34 having vertical sidewalls. The second insulating layer preferably extends horizontally outward from the top edge of the second polysilicon layer 34 as shown in FIG. 6. The controlled lateral etching of the second polysilicon layer removes between about 500 to 2000 Å of the second polysilicon layer. Etching of layer 34 can be performed with a Rainbow 4428 etcher from Lam Research Co. The main etch step can have about the following parameters: pressure 600 mTorr, power 450 watts, electrode gap 0.8 cm, Cl$_2$ flow of 420 sccm, SF$_6$ flow of 300 sccm, He flow of 150 sccm, etch rate about 3500 Å/min. to 4000 Å/min. The overetch step can have about the following parameters: pressure 450 mtorr, power 350 watts, electrode gap of 0.8 cm, Cl$_2$ flow of about 300 sccm, HBr flow of about 1000 sccm, O$_2$ flow of about 3 sccm, and an etch rate between about 2500 to 3000 Å/min.

Figure 7:
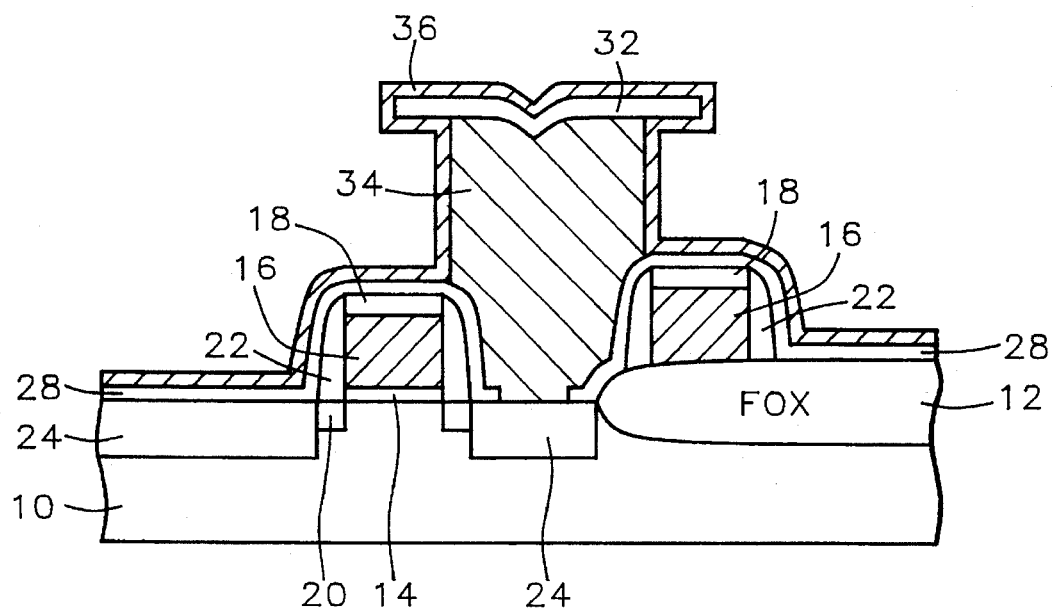

Afterwards, a third polysilicon layer 36 is deposited over the substrate surface as shown in FIG. 7. The third polysilicon layer 36 has a thickness about in the range of 500 to 1000 Å. The layer 36 is preferable deposited in an in-situ phosphorus doped process wherein the temperature is 570° C., the gas is the mixed gas of 15% PH$_3$ and 85% silane, and 5% PH$_3$ and 95% nitrogen. The mixed gas, 5% PH$_3$ and 95% nitrogen, plays the role of fine-tuning of the dopant concentration between wafers. Alternatively, the layer 36 could be a combination of in-situ doped polysilicon and undoped polysilicon with the former beneath. The undoped polysilicon is formed by LPCVD, the reaction gas is silane, the temperature is about 620° C., and pressure is about 300 mTorr. Layer 36 has a thickness about in the range of 500 to 1000 Å and a preferred thickness of about 650 Å.

Figure 8:
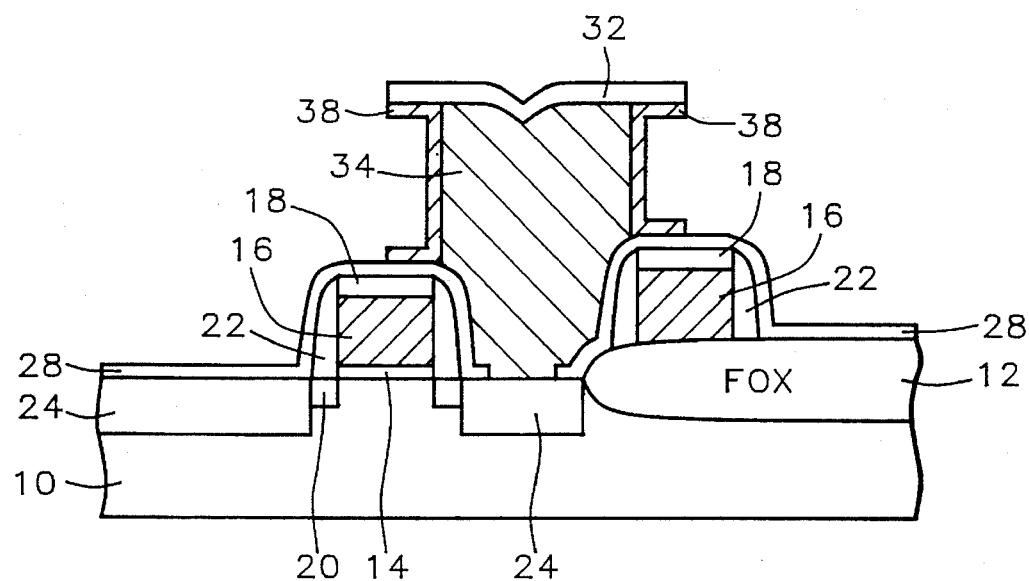

The third polysilicon layer 36 is next anisotropically etched leaving portions of the doped polysilicon layer 36 on the bottom of the second insulating layer 32, the vertical sidewalls of the second polysilicon layer 34 and on portions for the first insulating layer 28. The second and third polysilicon layer have an "I" shape as shown in FIG. 8.

Figure 9:
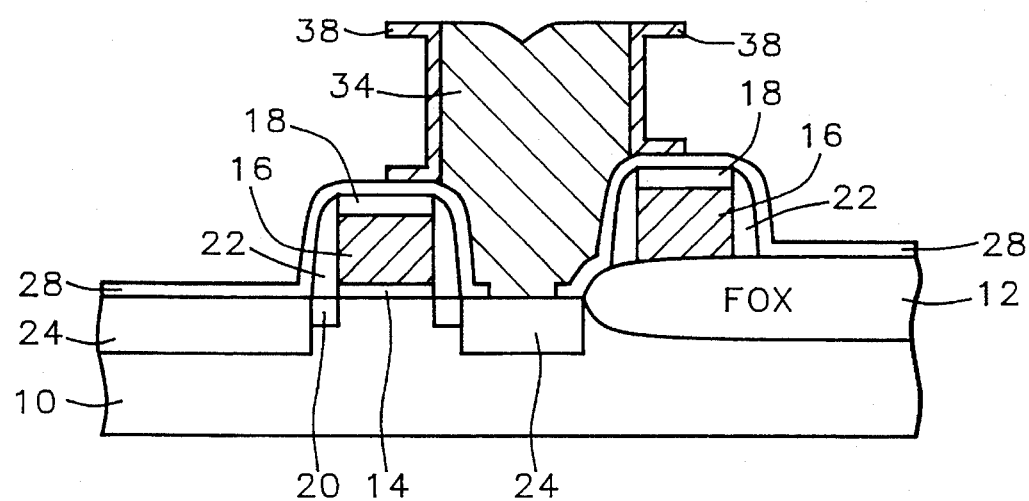
Figure 10:
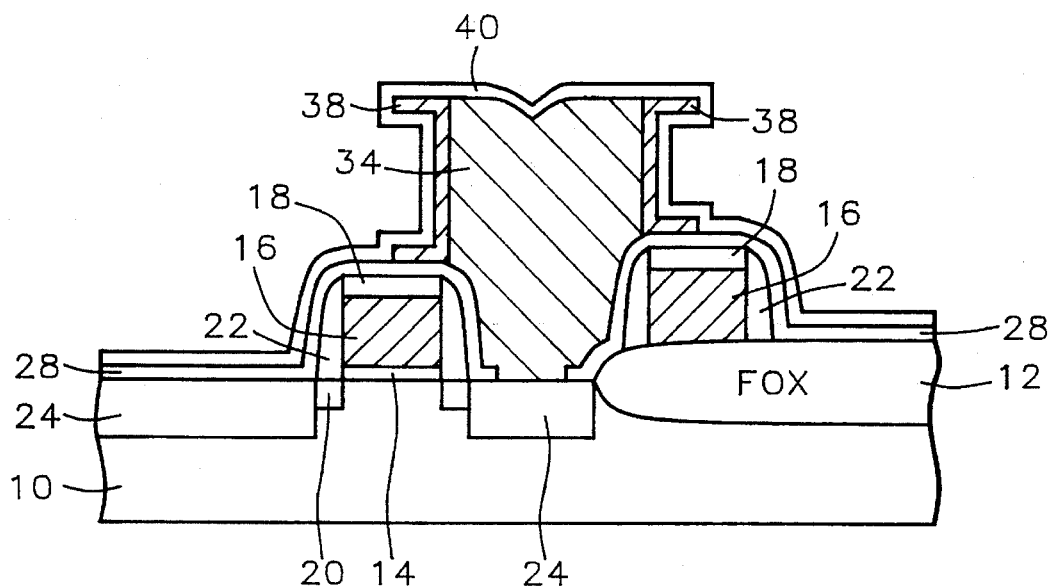

Referring to FIG. 9, the second insulating layer 32 is then removed whereby the second layer of polysilicon 34 and the doped polysilicon 38 layers form the bottom electrode of the stacked capacitor. Afterwards, a capacitor dielectric layer 40 is deposited over the substrate surface as displayed in FIG. 10. Capacitor dielectric 40 can be formed of a dielectric, such as ONO or Ta$_2$O$_5$. The capacitor dielectric 40 layer formed of a top silicon oxide, a silicon nitride and bottom silicon oxide (ONO) has a thickness for each layer in the range between about 30 to 90 Å. Layer 40 can have a thickness in the range of about 20 and 100 Å. The capacitor dielectric layer 40 is then patterned so that portions remain covering the bottom electrode of the capacitor.

A top contact polysilicon layer is formed over the capacitor dielectric layer 40. Top contact polysilicon layer has a thickness in the range of 500 to 2000 and preferably a thickness of 800 Å. Layer 42 can be doped using the same process described above used to dope second polysilicon layer 30. Next, the top contact polysilicon layer is patterned by a conventional process to form the top electrode 42 to complete the stacked capacitor.

Figure 11:
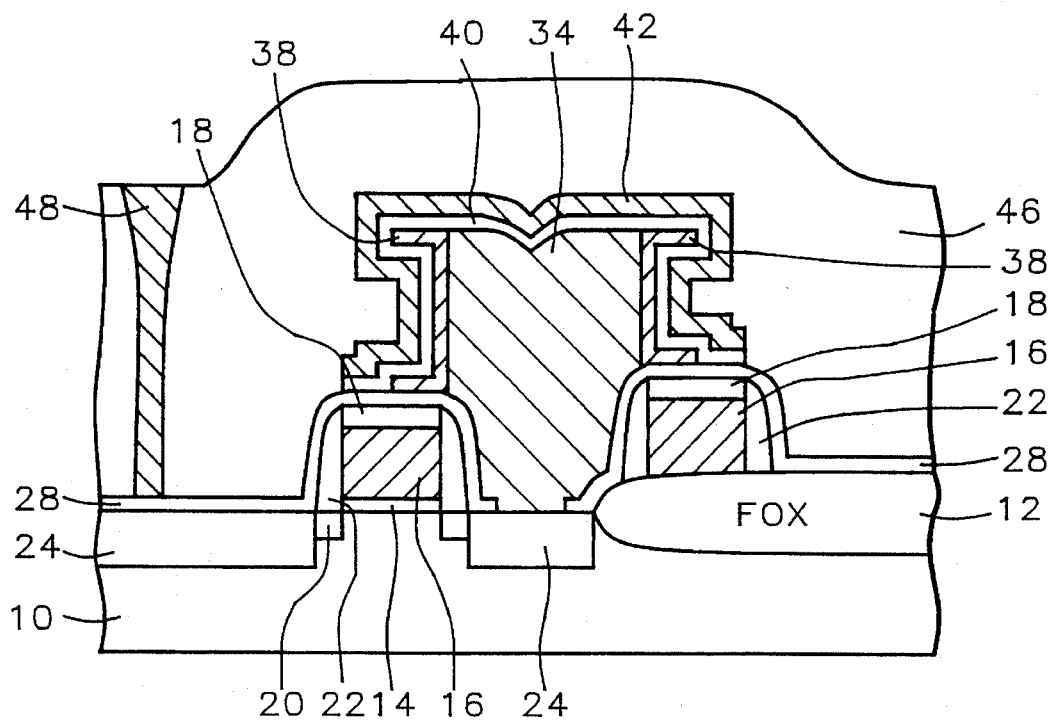

Insulator layer 46 is then formed over the substrate surface and electrical contact is made to source/drain 24 using metal via 48 as shown in FIG. 11. The layer 46 is a thick layer in the range of 2000 to 6000 Å or more can be planarized by heat flow or by etching. The layer 60 can be, for example, a phosphosilicate glass, a borophosphosilicated glass, or a silicon oxide-spin-on-glass sandwich or the like. Lithography and etching techniques are used to form the desired openings to a bit line contact. The desired contact metallurgy 48 is deposited and patterned as is known in the art. Higher levels of metallurgy (not shown) and passivation can in turn be formed over the metal layer 48 to complete the FET and DRAM devices. For example, a higher level of metallurgy contact to top capacitor electrode (not shown) is necessary. The process is continued as understood by those skilled in the art to form the required interconnection metallurgy and passivation to complete the integrated circuit of the invention. This invention provides a stacked capacitor with greater capacitance per unit area without using extra masking steps.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a dynamic random access memory device having a stacked capacitor comprising:

selectively forming field oxide areas on a surface of a semiconductor substrate defining a device area on the substrate surface for fabrication of field effect devices;

forming a gate dielectric layer on said substrate in said device area;

depositing a first polysilicon layer on said field oxide areas and said device area;

depositing a top gate insulating layer on the first polysilicon layer;

removing portions of said gate dielectric layer, first polysilicon layer and top gate insulating layer while leaving remaining portions thereof forming a gate structure in said device area, and forming interconnection lines over portions of said field oxide area, the remaining portions of the gate dielectric layer, first polysilicon layer and top gate insulating layer having substantially vertical sidewalls;

forming lightly doped source/drain structures over said device area associated with said gate structure;

forming sidewall spacers on the sidewalls of said gate dielectric layer, first polysilicon layer and top gate insulating layer after forming said lightly doped source/drain structures;

forming source/drain structures within said device area of said semiconductor substrate associated with said gate structure after forming said sidewall spacers;

forming a first insulating layer over said device area and field oxide areas after forming said source/drain structures;

patterning the first insulating layer leaving said source/drain structures open in said device area where electrical contact is formed to said stacked capacitor; and forming said stacked capacitor by, depositing a second polysilicon layer over the substrate surface, said second polysilicon layer contacting said source/drain structures;

depositing a second insulating layer over the second polysilicon layer;

patterning said second insulating layer and said second polysilicon layer so that remaining portions of the second insulating layer and the second polysilicon layer cover at least the device area between the gate structure and an interconnection line and cover parts of the gate structure and interconnection line;

laterally etching the second polysilicon layer so that portions of the second polysilicon layer are etched out beneath the patterned second insulating layer, the patterned second insulating layer having top and bottom sides, and the second polysilicon layer having vertical sidewalls;

depositing a third polysilicon layer over the substrate surface;

anisotropically etching the third polysilicon layer leaving portions of the third polysilicon layer on the bottom side of said patterned second insulating layer, on the vertical sidewalls of the second polysilicon layer and on portions of the first insulating layer;

removing the patterned second insulating layer;

depositing a capacitor dielectric layer over the substrate surface;

patterning the capacitor dielectric layer so that portions remain covering at least the second polysilicon layer and the third polysilicon layer;

forming a contact polysilicon layer over said capacitor dielectric layer;

patterning said contact polysilicon layer so that portions remain over the capacitor dielectric layer thereby forming a top electrode of the stacked capacitor; and forming metal lines, passivation layers, and contacts to complete the dynamic random access memory device.

2. The method of claim 1 wherein a thickness of said first polysilicon layer is between about 1000 to 3000 angstroms.

3. The method of claim 1 wherein a composition of said first insulating layer is a layer of silicon oxide and silicon nitride and the total thickness of said first insulating layer is between about 600 to 1500 angstroms.

4. The method of claim 1 wherein a thickness of said second polysilicon layer is between 2000 to 6000 angstroms.

5. The method of claim 1 wherein a thickness of said second insulating layer is between about 300 to 1000 angstroms.

6. The method of claim 1 wherein the lateral etching of the second polysilicon layer removes between about 500 to 2000 Å of the second polysilicon layer.

7. The method of claim 1 wherein the third polysilicon layer has a thickness in the range of 500 to 1000 Å.

8. The method of claim 1 wherein the capacitor dielectric layer is composed of a top silicon oxide and silicon nitride and bottom silicon oxide (ONO) and a thickness of the bottom oxide is between about 30 to 90 Å and a thickness of the silicon nitride is between about 30 to 90 Å and a thickness of the top oxide is between about 30 to 90 Å.

9. The method of claim 1 wherein a thickness of the top electrode of the capacitor is between about 500 to 2000 Å.

10. A method of fabricating a dynamic random access memory device including a stacked capacitor on a semiconductor substrate having a field oxide region, a device region, a gate structure formed in the device region, an interconnection line formed over said field oxide region, and source/drain regions associated with the gate structure, a first insulating layer over portions of the device and field oxide regions, an opening in the first insulating layer exposing source/drain regions where electrical contact is formed to the stacked capacitor, the method comprising:

forming a pattern of a second polysilicon layer and a second insulating layer over the opening in the first insulating layer, over portions of the device region, and over parts of said gate structure and said interconnection line, said second polysilicon layer contacting said source/drain regions;

laterally etching the second polysilicon layer so that portions of the second polysilicon layer are etched out beneath the second insulating layer, the second insulating layer having top and bottom sides, and the second polysilicon layer having vertical sidewalls;

forming a third polysilicon layer on said bottom side of said second insulating layer, and on said vertical sidewalls of the second polysilicon layer and on portions of said first insulating layer;

removing the second insulating layer after forming said third polysilicon layer;

forming a capacitor dielectric layer covering at least the second and third polysilicon layers;

forming a top electrode over the capacitor dielectric layer; and forming metal lines, passivation layers, and contacts, to complete the dynamic random access memory device.

11. The method of claim 10 wherein said gate structure is comprised of a gate dielectric layer, a first polysilicon layer, a top gate insulating layer, and sidewall spacers.

12. The method of claim 11 wherein a thickness of said first polysilicon layer is between about 1000 to 3000 angstroms.

13. The method of claim 10 wherein a composition of said first insulating layer is a layer of silicon oxide and silicon nitride wherein the total thickness is between about 600 to 1500 angstroms.

14. The method of claim 10 wherein a thickness of said second polysilicon layer is between about 2000 to 6000 angstroms.

15. The method of claim 10 wherein a thickness of said second insulating layer is between about 300 to 1000 angstroms.

16. The method of claim 10 wherein the lateral etching of the second polysilicon layer removes between about 500 to 2000 Å of the second polysilicon layer.

17. The method of claim 10 wherein the third polysilicon layer has a thickness in the range of 500 to 1000 Å.

18. The method of claim 10 wherein the capacitor dielectric layer is composed of a top silicon oxide and silicon nitride and bottom silicon oxide (ONO) wherein a thickness of the bottom oxide is between about 30 to 90 Å and a thickness of the silicon nitride is between about 30 to 90 Å and a thickness of the top oxide is between about 30 to 90 Å.

19. The method of claim 10 wherein a thickness of the top electrode of the capacitor is between about 500 to 2000 Å.

* * * * *